(12) United States Patent
Murase (10) Patent No.: US 8,941,742 B2
(45) Date of Patent: *Jan. 27, 2015

(54) LUMINANCE MEASUREMENT METHOD, LUMINANCE MEASUREMENT DEVICE, AND IMAGE QUALITY ADJUSTMENT TECHNIQUE USING THE METHOD AND DEVICE

(71) Applicant: IIX Inc., Shinagawa-ku, Tokyo (JP)

(72) Inventor: Hiroshi Murase, Tokyo (JP)

(73) Assignee: IIX Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/309,225

(22) Filed: Jun. 19, 2014

(65) Prior Publication Data

US 2014/0300756 A1 Oct. 9, 2014

Related U.S. Application Data

(63) Continuation-in-part of application No. 14/069,834, filed on Nov. 1, 2013, now Pat. No. 8,786,712, which is a continuation of application No. PCT/JP2013/060659, filed on Apr. 8, 2013.

(51) Int. Cl.
*H04N 17/02* (2006.01)
*G02F 1/1339* (2006.01)
(Continued)

(52) U.S. Cl.
CPC ................................ *H04N 17/00* (2013.01)
USPC ................... 348/189; 445/24; 438/15; 438/16

(58) Field of Classification Search
USPC ......... 348/187, 189–191, 790, 791, 795, 797, 348/800, 803; 445/3, 24, 63, 66; 427/58; 430/20, 321; 252/299.01; 349/58, 155; 438/26, 29, 30, 14–16, 125; 428/1.1, 428/1.3, 1.4
See application file for complete search history.

(56) References Cited

U.S. PATENT DOCUMENTS

| | | | | |
|---|---|---|---|---|
| 6,407,786 B1 * | 6/2002 | Yamamoto et al. | ............ | 349/113 |
| 7,808,545 B2 * | 10/2010 | Nakayama | .................... | 348/362 |

(Continued)

FOREIGN PATENT DOCUMENTS

| | | |
|---|---|---|
| JP | 2006-234414 A | 9/2006 |
| JP | 2009-156704 A | 7/2009 |

(Continued)

OTHER PUBLICATIONS

International Search Report issued in PCT/JP2013/060659 mailed on Jul. 16, 2013.

(Continued)

*Primary Examiner* — Victor Kostak
(74) *Attorney, Agent, or Firm* — Lowe Hauptman & Ham, LLP (57) ABSTRACT

Provided is a luminance measurement method for accurately measuring luminance of each pixel even if pixel images of a display panel overlap each other on an imaging surface of a camera. A central exposure factor indicating luminance of the central part of the pixel image is calculated on the basis of an output of a picture element corresponding to the central part. A peripheral exposure factor indicating luminance of the peripheral part of the pixel image is calculated on the basis of an output of picture elements corresponding to the peripheral part of the pixel image is calculated, all pixels of the display panel are sorted into a plurality of groups, sequentially turned on one group after another, and imaged by the camera, and the luminance of all the pixels of the display panel is calculated based on this imaged image, the central exposure factor, and the peripheral exposure factor.

16 Claims, 9 Drawing Sheets

(51) Int. Cl.
*H01L 23/00* (2006.01)
*H01L 23/498* (2006.01)
*H04N 17/00* (2006.01)

(56) References Cited

U.S. PATENT DOCUMENTS

2003/0214623 A1* 11/2003 Ebisu et al. .................. 349/156
2007/0009677 A1* 1/2007 Ebisu et al. .................. 428/1.54
2011/0229825 A1* 9/2011 Inoue et al. .................. 430/319

FOREIGN PATENT DOCUMENTS

JP 2010-203889 A 9/2010
WO 2011/151866 A1 12/2011

OTHER PUBLICATIONS

Written Opinion of the International Searching Authority (PCT/ISA/237) mailed on Jul. 16, 2013 for PCT International Application No. PCT/JP2013/060659, International Filing Date Aug. 4, 2013.

* cited by examiner

Fig.9

LUMINANCE MEASUREMENT METHOD, LUMINANCE MEASUREMENT DEVICE, AND IMAGE QUALITY ADJUSTMENT TECHNIQUE USING THE METHOD AND DEVICE

CROSS REFERENCE TO RELATED APPLICATIONS

This is a continuation in part application of U.S. patent application Ser. No. 14/069,834 filed on Nov. 1, 2013, which is a continuation application of PCT application serial number PCT/JP2013/060659, filed on Apr. 8, 2013, the entire contents of which are incorporated herein by reference.

TECHNICAL FIELD

The present invention relates to a luminance measurement method and a luminance measurement device that measure the luminance of pixels of a display panel, and an image quality adjustment technique using the method and the device.

BACKGROUND ART

It is known that display panels such as liquid crystal panels and organic EL panels exhibit display unevenness (luminance unevenness and color unevenness) due to variations in manufacturing. When each pixel of the display panel has R, G, and B subpixels, luminance unevenness occurs if the absolute brightness relationship differs between adjacent pixels even though the relative brightness relationship among R, G, and B in each pixel does not differ. Also, color unevenness occurs if the relative brightness relationship among R, G, and B in each pixel differs between adjacent pixels. Specifically, in organic EL panels, in which it is difficult to make the thickness of an organic compound layer in each pixel uniform, display unevenness is likely to occur due to uneven layer thicknesses and thus realizing a large screen size is difficult.

As a technique for improving the image quality of a display panel by reducing such display unevenness, Patent Literature 1, for example, discloses a luminance measurement method. In this method, all pixels (referred to as "picture element" in this patent literature) of the display panel are turned on, the pixels are imaged at a plurality of imaging points of a CCD camera (see FIG. 5 of this patent literature), and the luminance of the pixels is calculated on the basis of luminance data at the plurality of imaging points. Correction data for reducing display unevenness is generated using the calculated luminance of each pixel, and an input signal to the display panel is corrected according to this correction data, thereby enabling an improvement in image quality of the display panel.

CITATION LIST

Patent Literature

[Patent Literature 1] JP 2010-203889A

SUMMARY OF INVENTION

Technical Problem

In Patent Literature 1, it is assumed that each pixel of the display panel independently forms an image on an imaging surface of the camera and adjacent pixel images do not overlap each other. However, in fact, adjacent pixel images do overlap each other due to lens aberration of the camera and other factors. Therefore, in order to accurately measure the luminance of a pixel, the output of a picture element on the imaging surface at which an image of that pixel is located cannot directly be used without eliminating the influence of pixels adjacent to that pixel on that picture element.

The present invention was made in view of the above-described circumstances, and it is an object of the present invention to provide a luminance measurement method and a luminance measurement device that can accurately measure the luminance of each pixel even when pixel images on a display panel overlap each other on an imaging surface of a camera, and an image quality adjustment technique using the method and the device.

Solution to Problem

In order to achieve the above-described object, the invention according to claim 1 is a luminance measurement method including: an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other; an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image; an all-pixel imaging step of sorting all the pixels of the display panel into a plurality of groups, sequentially turning on the pixels one group after another, and imaging the pixels by the camera; and a luminance calculating step of calculating the luminance of all the pixels of the display panel on the basis of the image imaged in the all-pixel imaging step, the central exposure factor, and the peripheral exposure factor.

Another embodiment of the luminance measurement method further includes: an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

Another embodiment of the luminance measurement method further includes: an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

Another embodiment of the invention is a luminance measurement device including: a control unit that controls turning-on of pixels of a display panel and controls imaging by a camera that is provided with a solid-state image sensor; and a calculation unit that performs calculation based on an image imaged by the camera, wherein, when pixels of the display panel are imaged by the camera, the control unit turns on one or more pixels of the display panel and causes the camera to image the pixels such that each pixel image ranges over a plurality of picture elements on an imaging surface of the camera and the pixel images do not overlap each other, the calculation unit then calculates a central exposure factor that indicates the luminance of a central part of the pixel image as a percentage of the luminance of the entire pixel image, on the basis of an output of one or more picture elements that correspond to the central part of the imaged pixel image, and a peripheral exposure factor that indicates the luminance of a peripheral part of the pixel image as a percentage of the luminance of the entire pixel image, on the basis of an output of one or more picture elements that correspond to the peripheral part of the pixel image, the control unit sorts all the pixels of the display panel into a plurality of groups, sequentially turns on the pixels one group after another, and causes the camera to image the pixels, and the calculation unit then calculates the luminance of all the pixels of the display panel, on the basis of the imaged image, the central exposure factor, and the peripheral exposure factor.

According to the another embodiment of the luminance measurement device, the control unit causes the camera to image an alignment pattern that is obtained by turning on predetermined pixels of the display panel, and the calculation unit obtains a correspondence relationship between the pixels of the display panel and the picture elements of the camera by detecting on which picture elements of the camera the image of the alignment pattern is shown.

According to the another embodiment of the luminance measurement device, the control unit enlarges the pixel relative to the pixel that is used for obtaining the output of one or more picture elements that correspond to the central part of the pixel image, and the output of one or more picture elements that correspond to the peripheral part of the pixel image, and images the enlarged pixel, and the calculation unit obtains the luminance of the entire pixel image on the basis of the imaged image, and calculates the central exposure factor and the peripheral exposure factor.

Another embodiment of the invention is a correction data generation method including: an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other; an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image; an all-pixel imaging step of sorting all the pixels of the display panel into a plurality of groups, sequentially turning on the pixels one group after another, and imaging the pixels by the camera; a luminance calculating step of calculating the luminance of all the pixels of the display panel on the basis of the image imaged in the all-pixel imaging step, the central exposure factor, and the peripheral exposure factor; and a correction data generation step of generating correction data for reducing luminance unevenness of the display panel by correcting an input signal to the display panel on the basis of the luminance calculated in the luminance calculating step.

Another embodiment of the correction data generation method further includes: an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

Another embodiment of the correction data generation method further includes: an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

Another embodiment of a correction data generation device includes: a control unit that controls turning-on of pixels of a display panel and controls imaging by a camera that is provided with a solid-state image sensor; a calculation unit that performs calculation based on an image imaged by the camera; and a correction data generation unit that generates correction data for reducing luminance unevenness of the display panel by correcting an input signal to the display panel, wherein, when pixels of the display panel are imaged by the camera, the control unit turns on one or more pixels of the display panel and causes the camera to image the pixels such that each pixel image ranges over a plurality of picture elements on an imaging surface of the camera and the pixel images do not overlap each other, the calculation unit then calculates a central exposure factor that indicates the luminance of a central part of the pixel image as a percentage of the luminance of the entire pixel image, on the basis of an output of one or more picture elements that correspond to the central part of the imaged pixel image, and a peripheral exposure factor that indicates the luminance of a peripheral part of the pixel image as a percentage of the luminance of the entire pixel image, on the basis of an output of one or more picture elements that correspond to the peripheral part of the pixel image, the control unit sorts all the pixels of the display panel into a plurality of groups, sequentially turning on the pixels one group after another, and causes the camera to image the pixels, the calculation unit then calculates the luminance of all the pixels of the display panel, on the basis of the imaged image, the central exposure factor, and the peripheral exposure factor, and the correction data generation unit generates the correction data based on the luminance of all the pixels of the display panel.

According to another embodiment of the correction data generation device, the control unit causes the camera to image an alignment pattern that is obtained by turning on predetermined pixels of the display panel, and the calculation unit obtains a correspondence relationship between the pixels of the display panel and the picture elements of the camera by detecting on which picture elements of the camera the image of the alignment pattern is shown.

According to another embodiment of the correction data generation device, the control unit enlarges the pixel relative to the pixel that is used for obtaining the output of one or more picture elements that correspond to the central part of the pixel image, and the output of one or more picture elements that correspond to the peripheral part of the pixel image, and images the enlarged pixel, and the calculation unit obtains the luminance of the entire pixel image on the basis of the imaged image, and calculates the central exposure factor and the peripheral exposure factor.

Another embodiment of the invention is a method for manufacturing an image quality adjustment type display panel including: an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other; an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image; an all-pixel imaging step of sorting all the pixels of the display panel into a plurality of groups, sequentially turning on the pixels one group after another, and imaging the pixels by the camera; a luminance calculating step of calculating the luminance of all the pixels of the display panel on the basis of the image imaged in the all-pixel imaging step, the central exposure factor, and the peripheral exposure factor; a correction data generation step of generating correction data for reducing luminance unevenness of the display panel by correcting an input signal to the display panel on the basis of the luminance calculated in the luminance calculating step; and a correction data storage step of storing the correction data in a storage unit of an image quality adjustment circuit, and a mounting step of mounting the image quality adjustment circuit to the display panel so that the image quality adjustment circuit corrects the input signal on the basis of the correction data.

Another embodiment of the method for manufacturing an image quality adjustment type display panel further includes: an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

Another embodiment of the method for manufacturing an image quality adjustment type display panel further includes: an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

Another embodiment of the invention is an image quality adjustment type display panel including: a display panel; and an image quality adjustment circuit that is provided with a storage unit in which correction data for correcting an input signal to the display panel so as to reduce display unevenness of the display panel is stored, wherein the storage unit has stored therein correction data that is generated based on the luminance of all the pixels of the display panel, the luminance of all the pixels of the display panel being calculated by, when pixels of the display panel are imaged by a camera that is provided with a solid-state image sensor, turning on one or more pixels of the display panel and imaging the pixels by the camera such that each pixel image ranges over a plurality of picture elements on an imaging surface of the camera and the pixel images do not overlap each other, by calculating a central exposure factor that indicates the luminance in a central part of the pixel image as a percentage of the luminance of the entire pixel image, on the basis of an output of one or more picture elements that correspond to the central part of the imaged pixel image, and a peripheral exposure factor that indicates the luminance in a peripheral part of the pixel image as a percentage of the luminance of the entire pixel image, on the basis of an output of one or more picture elements that correspond to the peripheral part of the pixel image, by sorting all the pixels of the display panel into a plurality of groups, sequentially turning on the pixels one group after another, and imaging the pixels by the camera, and by calculating the luminance of all the pixels of the display panel, on the basis of the imaged image, the central exposure factor, and the peripheral exposure factor.

According to another embodiment of invention, pixels of the display panel are imaged by the camera such that the pixel images of the display panel do not overlap each other on the imaging surface of the camera, the central exposure factor that indicates the luminance of the central part of the pixel image as a percentage of the luminance of the entire pixel image, and the peripheral exposure factor that indicates the luminance of the peripheral part of the pixel image as a percentage of the luminance of the entire pixel image are calculated, then all the pixels of the display panel are sorted into a plurality of groups, sequentially turned on one group after another, and imaged by the camera, and the luminance of all the pixels of the display panel is calculated based on this imaged image, the central exposure factor, and the peripheral exposure factor. Therefore, even when pixel images of the display panel overlap each other on the imaging surface of the camera, it is possible to accurately measure the luminance of the pixels by eliminating the influence of adjacent pixel images.

According to another embodiment of the invention, a correspondence relationship between the pixels of the display panel and the picture elements of the camera is obtained by imaging by the camera an alignment pattern that is obtained by turning on predetermined pixels of the display panel, and detecting on which picture elements of the camera the image of the alignment pattern is shown. Therefore, by using this correspondence relationship, it is possible to increase the accuracy of the relationship between the imaging result (output of the picture elements) and the luminance of each pixel, and achieve more accurate measurement of the luminance of each pixel.

According to another embodiment of the invention, the luminance of the entire pixel image is obtained by enlarging the pixel image (such that the pixel image ranges over a large number of picture elements on the imaging surface) and imaging the enlarged pixel image. Therefore, it is possible to suppress a reduction in measurement accuracy caused by non-light receiving units disposed between picture elements on the imaging surface, and achieve more accurate measurement of the luminance of each pixel.

According to another embodiment of the invention, pixels of the display panel are imaged by the camera such that the pixel images of the display panel do not overlap each other on the imaging surface of the camera, the central exposure factor that indicates the luminance of a central part of the pixel image as a percentage of the luminance of the entire pixel image, and the peripheral exposure factor that indicates the luminance of a peripheral part of the pixel image as a percentage of the luminance of the entire pixel image are calculated, then all the pixels of the display panel are sorted into a plurality of groups, sequentially turned on one group after another, and imaged by the camera, and the luminance of all the pixels of the display panel is calculated based on this imaged image, the central exposure factor, and the peripheral exposure factor. Therefore, even when pixel images of the display panel overlap each other on the imaging surface of the camera, it is possible to accurately measure the luminance of the pixels by eliminating an influence of adjacent pixel images. Also, since correction data for reducing luminance unevenness of the display panel is generated based on this luminance of the pixels of the display panel, it is possible to generate the correction data that enable the image quality of the display panel to be adjusted with high accuracy.

According to another embodiment of the invention, a correspondence relationship between the pixels of the display panel and the picture elements of the camera is obtained by imaging by the camera an alignment pattern that is obtained by turning on predetermined pixels of the display panel, and detecting on which picture elements of the camera the image of the alignment pattern is shown. Therefore, by using this correspondence relationship, it is possible to increase the accuracy of the relationship between the imaging result (output of the picture elements) and the luminance of each pixel, and achieve more accurate measurement of the luminance of each pixel. Also, since correction data for reducing luminance unevenness of the display panel is generated based on this luminance of the pixels of the display panel, it is possible to generate the correction data that enable the image quality of the display panel to be adjusted with high accuracy.

According to another embodiment of the invention, the luminance of the entire pixel image is obtained by enlarging the pixel image (such that the pixel image ranges over a large number of picture elements on the imaging surface) and imaging the enlarged pixel image. Therefore, it is possible to suppress a reduction in measurement accuracy caused by non-light receiving units disposed between picture elements on the imaging surface, and achieve more accurate measurement of the luminance of each pixel. Also, since correction data for reducing luminance unevenness of the display panel is generated based on this luminance of the pixels of the display panel, it is possible to generate the correction data that enable the image quality of the display panel to be adjusted with high accuracy.

According to another embodiment of the invention, since the correction data is generated and the image quality adjustment circuit in which this correction data is stored is mounted to the display panel, it is possible to adjust the image quality of the display panel with high accuracy.

According to another embodiment of the invention, since the correction data is generated and the image quality adjustment circuit in which this correction data is stored is mounted to the display panel, it is possible to adjust the image quality of the display panel with high accuracy.

According to another embodiment of the invention, since the correction data is generated and the image quality adjustment circuit in which this correction data is stored is mounted to the display panel, it is possible to adjust the image quality of the display panel with high accuracy.

Advantageous Effects of Invention

According to the present invention, even if pixel images of a display panel overlap each other on an imaging surface of a camera, it is possible to accurately measure the luminance of the pixels, and also to improve image quality of the display panel using this measured luminance.

DESCRIPTION OF EMBODIMENTS

The following describes embodiments for implementing the present invention with reference to the drawings.

Embodiment 1

Figure 1:
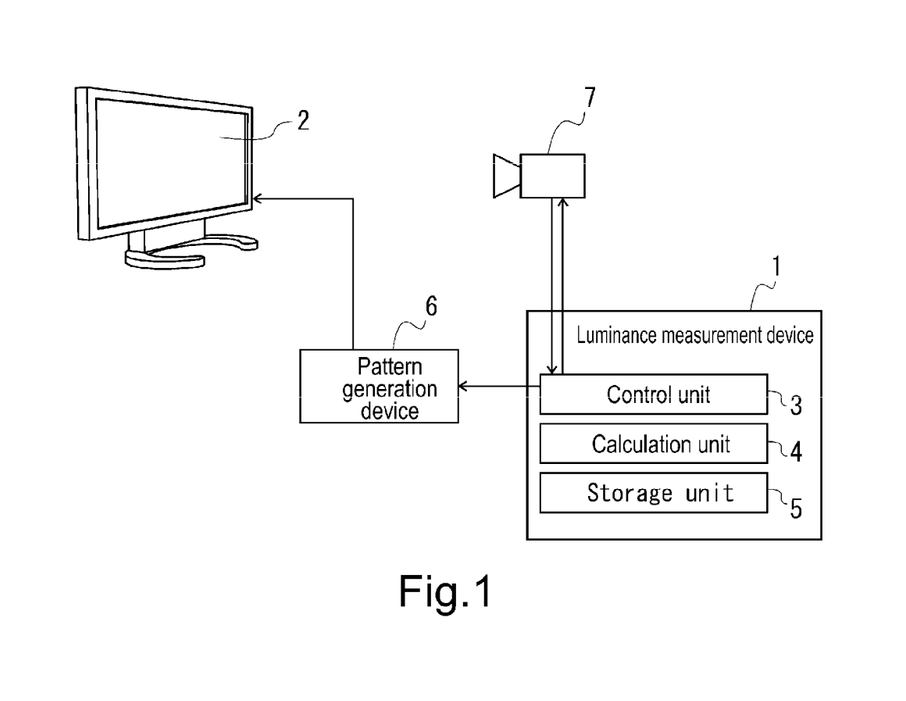
FIG. 1 is a diagram illustrating a luminance measurement device according to Embodiment 1.

FIG. 1 illustrates a luminance measurement device according to the present embodiment. This luminance measurement device 1 measures the luminance of all pixels of an organic EL panel 2 (each pixel of the organic EL panel 2 is made up of R, G, and B subpixels, and it is assumed in the present invention that "pixel" encompasses such subpixels), and includes a control unit 3, a calculation unit 4, and a storage unit 5. The control unit 3 controls display of the organic EL panel 2 via a pattern generation device 6, and controls imaging by a monochrome solid-state imaging camera 7 that is disposed facing the organic EL panel 2. The calculation unit 4 performs various types of calculation based on the image that was imaged by the camera 7 or the like, and the storage unit 5 stores the imaging result of the camera 7 and the calculation results of the calculation unit 4.

Figure 2:
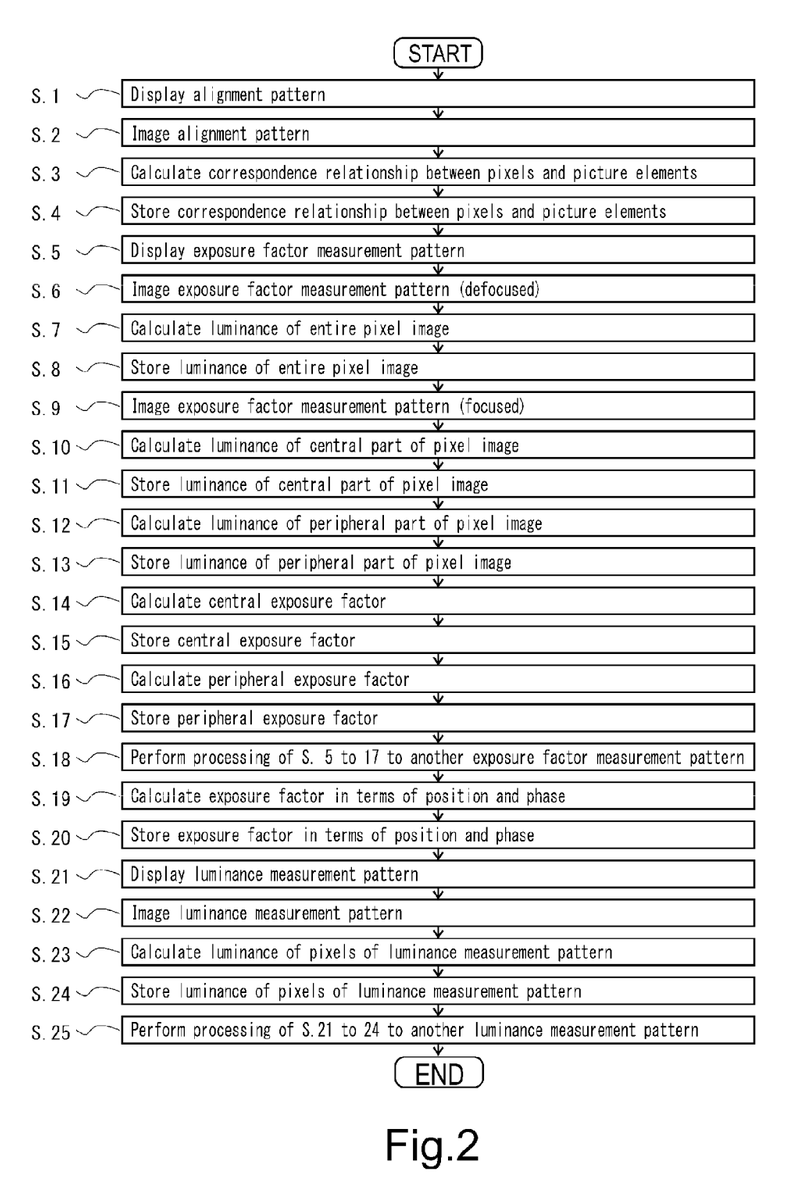
FIG. 2 is a flow diagram illustrating a luminance measurement method according to Embodiment 1.
Figure 3:
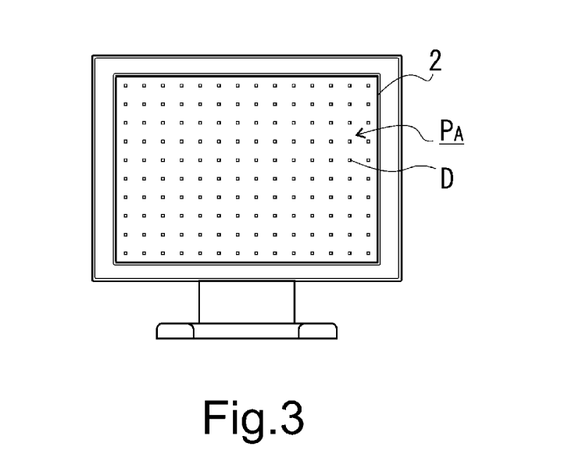
FIG. 3 is a diagram illustrating an alignment pattern.

As illustrated in FIG. 2, when the luminance measurement device 1 measures the luminance of pixels of the organic EL panel 2 while the pixels are being displayed in red, the control unit 3 first instructs the pattern generation device 6 to display an alignment pattern $P_A$ shown in FIG. 3 on the organic EL panel 2 (step 1 (in the drawing, this step is denoted with "S. 1"; hereinafter, the same applies to other steps)). The alignment pattern $P_A$ is a pattern in which red square dots D are aligned in a matrix, by turning on predetermined pixels (R subpixels) located at specific positions on the organic EL panel 2.

The control unit 3 causes the camera 7 to image the organic EL panel 2 on which the alignment pattern $P_A$ is shown (step 2), and the calculation unit 4 detects, based on this imaged image, on which picture elements on an imaging surface of the camera 7 the image of the dots D is shown, and obtains a positional correspondence relationship between the pixels of the organic EL panel 2 and the picture elements of the camera 7 (step 3), and causes the storage unit 5 to store the correspondence relationship (step 4).

Figure 4:
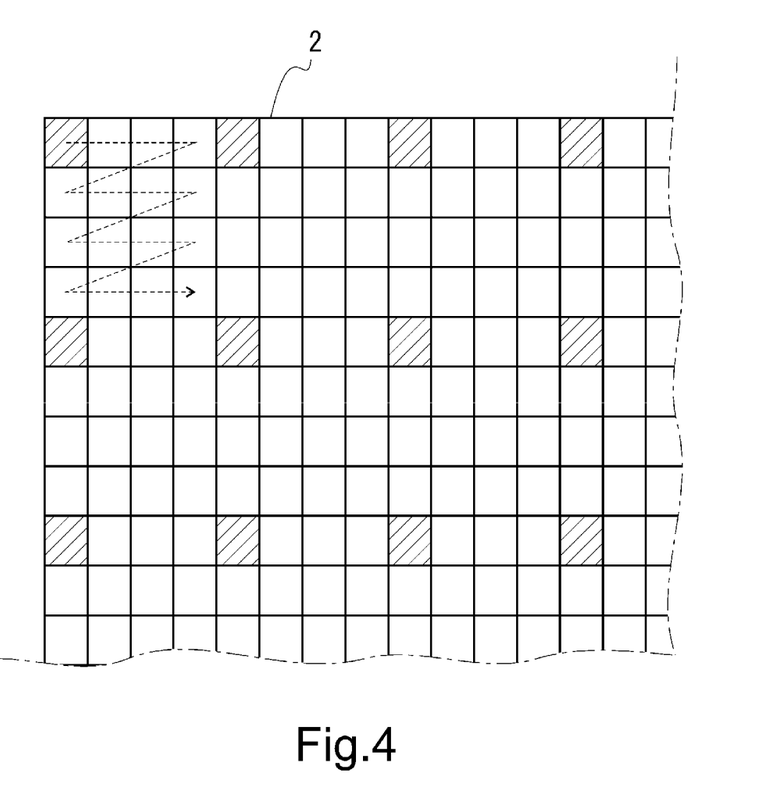
FIG. 4 is a diagram illustrating an enlarged exposure factor measurement pattern.
Figure 5:
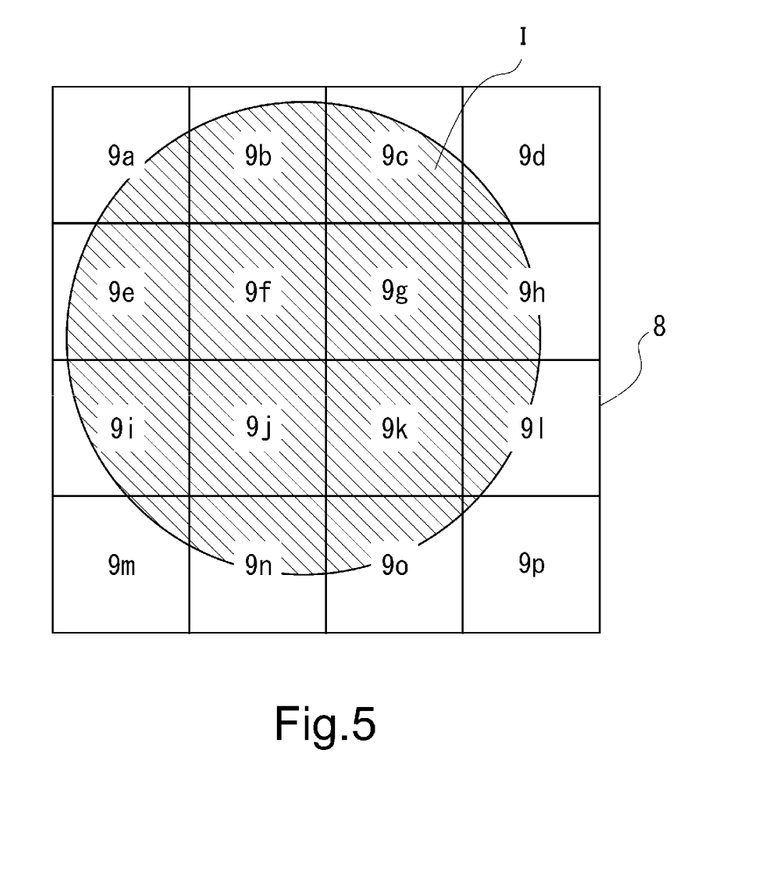
FIG. 5 is a diagram illustrating an example of a pixel image on an imaging surface when the pixel image is defocused.

Next, the control unit 3 instructs the pattern generation device 6 to display an exposure factor measurement pattern $P_{K1}$ shown in FIG. 4 on the organic EL panel 2 (step 5). The exposure factor measurement pattern $P_{K1}$ is a pattern obtained by turning on: the most upper left pixel of the organic EL panel 2, every fourth pixel rightward of this pixel, and every fourth pixel downward of these pixels, and the control unit 3 causes the camera 7 to defocus and image the exposure factor measurement pattern $P_{K1}$ (step 6). Although the shape and size of pixel images on the imaging surface of the camera 7 vary depending on the positions of the pixel images on the imaging surface, it is here assumed that a pixel image has a size that generally ranges over 4×4 picture elements of the camera 7 and, for example, as shown in FIG. 5, a pixel image I ranges over picture elements 9a to 9p on the imaging surface 8 of the camera 7. Also, adjacent pixel images do not overlap each other on the imaging surface of the camera 7.

The calculation unit 4 obtains the luminance of the entire pixel image on the basis of the image imaged in step 5 (step 7). For example, the luminance of the entire pixel image I can be obtained from outputs of the picture elements 9a to 9p. The obtained luminance of the entire image of pixels that are turned-on and constitute the exposure factor measurement pattern $P_{K1}$ is stored in the storage unit 5 (step 8).

Figure 6:
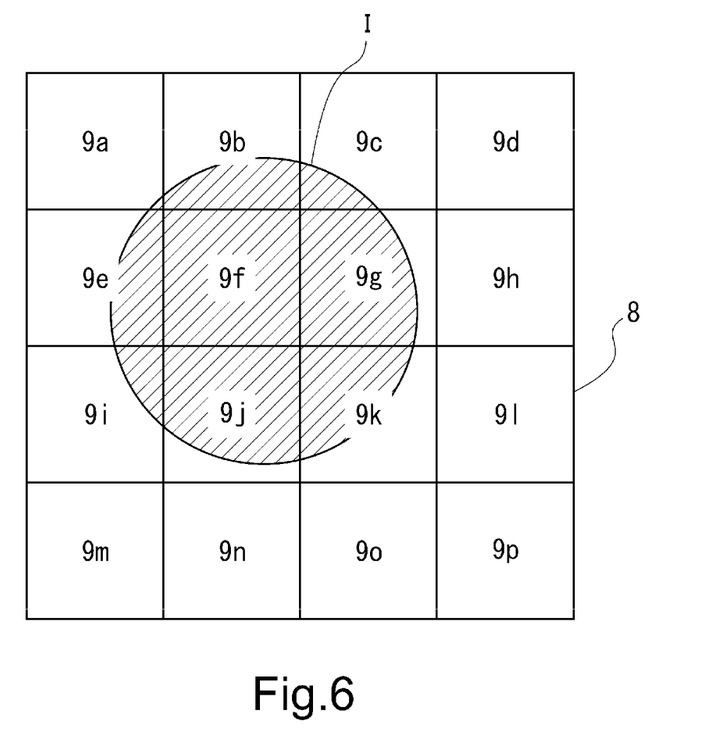
FIG. 6 is a diagram illustrating an example of a pixel image on an imaging surface when the pixel image is focused.

Subsequently, the control unit 3 causes the camera 7 to focus and image the exposure factor measurement pattern $P_{K1}$ (step 9). As described above, the shape and size of pixel images on the imaging surface of the camera 7 differ from each other depending on the position on the imaging surface on which the pixel image is located, but it is here assumed that the pixel image has a size that generally ranges over 3×3 picture elements of the camera 7. For example, as shown in FIG. 6, the pixel image I ranges over the picture elements 9a to 9c, 9e to 9g, and 9i to 9k on the imaging surface 8 of the camera 7. That is, the pixel image I is reduced in size compared to the case where the image is defocused and imaged (FIG. 5) (in other words, the pixels are enlarged and imaged in step 6 in which the pixel image ranges over a larger number of picture elements than the pixel image in step 9), and, at this time, adjacent pixel images do of course not overlap each other.

The calculation unit 4 obtains the luminance of the central part of the pixel image on the basis of the image imaged in step 9 (step 10), causes the storage unit 5 to store that obtained luminance (step 11), obtains the luminance in the eight peripheral parts of the pixel image (step 12), and causes the storage unit 5 to store that obtained luminance (step 13). Here, the luminance of the central part of the pixel image is assumed to be a luminance that depends on the output of a picture element where the centroid of the pixel image is located, and the luminance in the eight peripheral parts of the pixel image is assumed to be a luminance that depends on the outputs of eight picture elements adjacent to that picture element at which the centroid is located. Therefore, in FIG. 6, the luminance of the central part of the pixel image I is obtained from the output of the picture element 9f, the luminance in a first peripheral part of the pixel image I is obtained from the picture element 9a, the luminance in a second peripheral part of the pixel image I is obtained from the output of the picture element 9b, the luminance in a third peripheral part of the pixel image I is obtained from the output of the picture element 9c, the luminance in a fourth peripheral part of the pixel image I is obtained from the output of the picture element 9e, the luminance in a fifth peripheral part of the pixel image I is obtained from the output of the picture element 9g, the luminance in a sixth peripheral part of the pixel image I is obtained from the output of the picture element 9i, the luminance in a seventh peripheral part of the pixel image I is obtained from the output of the picture element 9j, and the luminance in an eighth peripheral part of the pixel image I is obtained from the output of the picture element 9k.

Moreover, the calculation unit 4 calculates the central exposure factor by dividing the luminance of the central part of the pixel image that was obtained in step 10 by the luminance of the entire pixel image that was obtained in step 7 (step 14), causes the storage unit 5 to store the calculated central exposure factor (step 15), calculates eight peripheral exposure factors by dividing the luminance in each of the eight peripheral parts of the pixel image that were obtained in step 12 by the luminance of the entire pixel image that was obtained in step 7 (step 16), and causes the storage unit 5 to store the calculated eight peripheral exposure factors (step 17).

Then, the luminance measurement device 1 performs similar processing to the processing from step 5 to step 15 on: an exposure factor measurement pattern $P_{K2}$ obtained by turning on pixels that are one pixel rightward of the pixels turned on in the exposure factor measurement pattern $P_{K1}$; an exposure factor measurement pattern $P_{K3}$ obtained by turning on pixels that are two pixels rightward of the pixels turned on in the exposure factor measurement pattern $P_{K1}$; an exposure factor measurement pattern $P_{K4}$ obtained by turning on pixels that are three pixels rightward of the pixels turned on in the exposure factor measurement pattern $P_{K1}$; an exposure factor measurement pattern $P_{K5}$ obtained by turning on pixels that are one pixel downward of the pixels turned on in the exposure factor measurement pattern $P_{K1}$; an exposure factor measurement pattern $P_{K6}$ obtained by turning on pixels that are one pixel downward of the pixels turned on in the exposure factor measurement pattern $P_{K2}$; an exposure factor measurement pattern $P_{K7}$ obtained by turning on pixels that are one pixel downward of the pixels turned on in the exposure factor measurement pattern $P_{K3}$; an exposure factor measurement pattern $P_{K8}$ obtained by turning on pixels that are one pixel downward of the pixels turned on in the exposure factor measurement pattern $P_{K4}$; an exposure factor measurement pattern $P_{K9}$ obtained by turning on pixels that are two pixels downward of the pixels turned on in the exposure factor measurement pattern $P_{K1}$; an exposure factor measurement pattern $P_{K10}$ obtained by turning on pixels that are two pixels downward of the pixels turned on in the exposure factor measurement pattern $P_{K2}$; an exposure factor measurement pattern $P_{K11}$ obtained by turning on pixels that are two pixels downward of the pixels turned on in the exposure factor measurement pattern $P_{K3}$; an exposure factor measurement pattern $P_{K12}$ obtained by turning on pixels that are two pixels downward of the pixels turned on in the exposure factor measurement pattern $P_{K4}$; an exposure factor measurement pattern $P_{K13}$ obtained by turning on pixels that are three pixels downward of the pixels turned on in the exposure factor measurement pattern $P_{K1}$; an exposure factor measurement pattern $P_{K14}$ obtained by turning on pixels that are three pixels downward of the pixels turned on in the exposure factor measurement pattern $P_{K2}$; an exposure factor measurement pattern $P_{K15}$ obtained by turning on pixels that are three pixels downward of the pixels turned on in the exposure factor measurement pattern $P_{K3}$; an exposure factor measurement pattern $P_{K16}$ obtained by turning on pixels that are three pixels downward of the pixels turned on in the exposure factor measurement pattern $P_{K4}$. The luminance measurement device 1 then calculates, with respect to each pixel, a central exposure factor and eight peripheral exposure factors (hereinafter, collectively referred to as "exposure factors"), and causes the storage unit 5 to store the calculated exposure factors (step 18). Accordingly, nine exposure factors in total are calculated with respect to all the pixels of the organic EL panel 2.

Meanwhile, the exposure factor varies due to lens aberration of the camera 7 or the like, depending on a position (a position of the picture element on the imaging surface at which the centroid of the pixel image is located) or a phase (the displacement between the centroid and the center of the picture element on which the centroid of the pixel image is located) of the pixel image on the imaging surface of the camera 7. That is, the exposure factor is determined by four parameters, that is, the $\delta_X$ and $\delta_Y$ positions of the pixel image and the $\alpha_X$ and $\alpha_Y$ phases, although the exposure factors of pixels that were obtained in steps 5 to 18 cannot readily be used in the later described step 23 or the like since the respective pixels have different positions and phases. Therefore, the calculation unit 4 calculates the exposure factor of representative positions and phases for each area in the organic EL panel 2 on the basis of the obtained exposure factor of each pixel (step 19), and causes the storage unit 5 to store the calculated exposure factors in an exposure factor table (step 20). The exposure factor of the representative positions and phases is calculated for each area of the organic EL panel 2 for the following reasons. The shape of a pixel image is substantially circular, elliptical or the like, depending on the area of the organic EL panel 2 (depending on the area of the imaging surface of the camera 7). Accordingly, preparation of the exposure factors of a number of positions and phases in areas where the pixel image is substantially circular and the exposure factors of a number of positions and phases in areas where the pixel image is substantially elliptical enables the exposure factor of a substantially circular pixel image to be obtained if needed by interpolating a representative exposure factor for areas in which the pixel image is substantially circular and the exposure factor of a substantially elliptical pixel image to be obtained if needed by interpolating a representative exposure factor for areas in which the pixel image is substantially elliptical.

Figure 7:
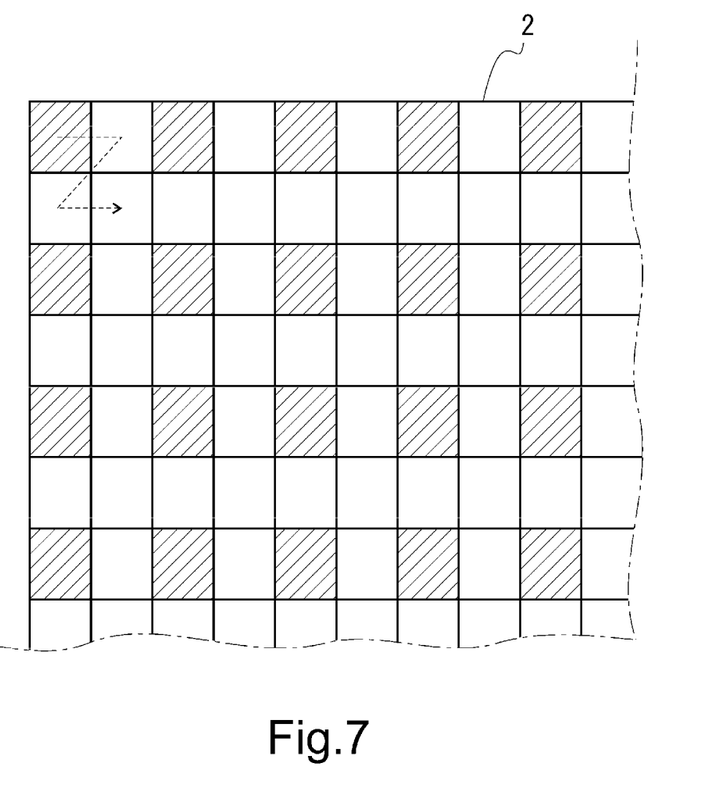
FIG. 7 is a diagram illustrating an enlarged luminance measurement pattern.

When the exposure factor table is obtained, the control unit 3 instructs the pattern generation device 6 to display a luminance measurement pattern $P_{B1}$ shown in FIG. 7 on the organic EL panel 2 (step 21). The luminance measurement pattern $P_{B1}$ is a red image that is shown on the organic EL panel 2 and obtained by simultaneously turning on the most upper left pixels of the organic EL panel 2 (R subpixels), every other pixel (R subpixels) moving rightward from that pixel, and every other pixel (R subpixels) moving downward from these pixels, in which adjacent pixel images on the imaging surface of the camera 7 overlap each other when the organic EL panel 2 has a high resolution.

The control unit 3 causes the camera 7 to image the organic EL panel 2 on which the luminance measurement pattern $P_{B1}$ is shown (step 22), and the calculation unit 4 calculates, based on this imaged image, the luminance of the pixels constituting the luminance measurement pattern $P_{B1}$ (step 23), and cause the storage unit 5 to store the calculated luminance (step 24).

Figure 8:
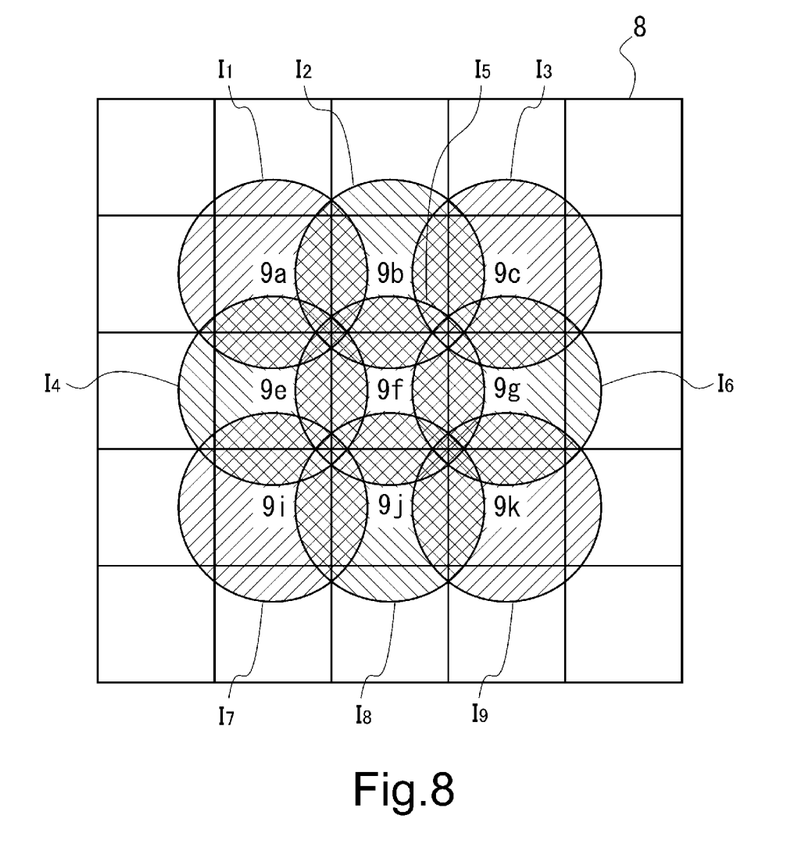
FIG. 8 is a diagram illustrating an example in which pixel images overlap each other on an imaging surface.

Specifically, based on the correspondence relationship between the pixels of the organic EL panel 2 and the picture elements of the camera 7 that was obtained in step 3, and the exposure factor table that was generated in steps 19 and 20, the calculation unit 4 can recognize which pixel image of the organic EL panel 2 is shown on picture elements of the camera 7. That is, since it is clear from the correspondence relationship that an arbitrary pixel image of the organic EL panel 2 is shown centering on a given picture element of the camera 7, and it is also clear from the exposure factor table which picture elements on the periphery of a "given picture element" the "arbitrary pixel image" ranges over, the calculation unit 4 can know how much each picture element of the camera 7 is influenced by any given pixel of the organic EL panel 2. Also, the output of each picture element of the camera 7 (an amount of received light of each picture element) is clear from the measurement, whereas in the organic EL panel 2 the luminance of each pixel constituting the luminance measurement pattern $P_{B1}$ is unknown. As shown in FIG. 8, for example, when the picture element 9*f* of the camera 7 corresponds to the central part of the pixel image $I_5$, and a peripheral part of the pixel images $I_1$ to $I_4$ and $I_6$ to $I_9$, the following equation holds:

$$B_{9f} = k_9 X_1 + k_8 X_2 + k_7 X_3 + k_6 X_4 + k_5 X_5 + k_4 X_6 + k_3 X_7 + k_2 X_8 + k_1 X_9$$

where $B_{9f}$ denotes the luminance that corresponds to the output of the picture element 9*f*, $X_5$ denotes the luminance of the pixel image $I_5$, and $k_5$ denotes the exposure factor of the central part, $X_1$ denotes the luminance of the pixel image $I_1$, and $k_9$ denotes the exposure factor in the peripheral part of the picture element 9*f*, $X_2$ denotes the luminance of the pixel image $I_2$, and $k_8$ denotes the exposure factor in the peripheral part of the picture element 9*f*, $X_3$ denotes the luminance of the pixel image $I_3$, and $k_7$ denotes the exposure factor in the peripheral part of the picture element 9*f*, $X_4$ denotes the luminance of the pixel image $I_4$, and $k_6$ denotes the exposure factor in the peripheral part of the picture element 9*f*, $X_6$ denotes the luminance of the pixel image $I_6$, and $k_4$ denotes the exposure factor in the peripheral part of the picture element 9*f*, $X_7$ denotes the luminance of the pixel image $I_7$, and $k_3$ denotes the exposure factor in the peripheral part of the picture element 9*f*, $X_8$ denotes the luminance of the pixel image $I_8$, and $k_2$ denotes the exposure factor in the peripheral part of the picture element 9*f*, and $X_9$ denotes the luminance of the pixel image $I_9$, and $k_1$ denotes the exposure factor in the peripheral part of the picture element 9*f*.

Since such an equation is also holds for other picture elements, the calculation unit 4 can obtain the luminance of the pixels constituting the luminance measurement pattern $P_{B1}$ by solving a simultaneous linear equation that is constituted by these equations for an unknown X.

Thereafter, the luminance measurement device 1 performs the same procedures as in steps 21 to 24 on a luminance measurement pattern $P_{B2}$ obtained by turning on the pixels to the right of the turned-on pixels of the luminance measurement pattern $P_{B1}$, a luminance measurement pattern $P_{B3}$ obtained by turning on the pixels below the turned-on pixels of the luminance measurement pattern $P_{B1}$, and a luminance measurement pattern $P_{B4}$ obtained by turning on the pixels below the turned-on pixels of the luminance measurement pattern $P_{B2}$, and calculates the luminance of each of the pixels constituting the luminance measurement patterns $P_{B2}$, $P_{B3}$, and $P_{B4}$ (step 25). Thus, the luminance of all the pixels of the organic EL panel 2 is calculated.

Although the above has described a method in which the luminance measurement device 1 measures the luminance of pixels of the organic EL panel 2 that are being displayed in red (the luminance of all R subpixels), the luminance measurement device 1 can also measure the luminance of pixels of the organic EL panel 2 that are being displayed in green (the luminance of all G subpixels), and the luminance of pixels of the organic EL panel 2 that are being displayed in blue (the luminance of all B subpixels).

In the luminance measurement method performed by the luminance measurement device 1 according to the present embodiment, pixels of the organic EL panel 2 are imaged by the camera 7 such that pixel images of the organic EL panel 2 do not overlap each other on the imaging surface 8 of the camera 7, the central exposure factor that indicates the luminance of a central part of the pixel image as a percentage of the luminance of the entire pixel image and the peripheral exposure factor that indicates the luminance of a peripheral part of the pixel image as a percentage of the luminance of the entire pixel image are calculated, then all the pixels of the organic EL panel 2 are sorted into a plurality of groups (the luminance measurement patterns $P_{B1}$, $P_{B2}$, $P_{B3}$, and $P_{B4}$), sequentially turned on one group after another, and imaged by the camera 7, and the luminance of all the pixels of the organic EL panel 2 is calculated on the basis of the imaged image, the central exposure factor, and the peripheral exposure factor. Therefore, even when the pixel images of the organic EL panel 2 overlap each other on the imaging surface 8 of the camera 7, it is possible to accurately measure the luminance of each pixel by eliminating the influence of adjacent pixel images.

Also, in the luminance measurement device 1, a correspondence relationship between the pixels of the organic EL panel 2 and the picture elements of the camera 7 is obtained by imaging the alignment pattern $P_A$ obtained by turning on predetermined pixels of the organic EL panel 2 by the camera 7, and detecting on which picture elements of the camera 7 the image of the alignment pattern $P_A$ is shown, and the use of this correspondence relationship increases the accuracy of the relationship between the imaging result and the pixel luminance. Also, since a pixel image is enlarged and imaged in step 6 and then the luminance of the entire pixel image is obtained in step 7, it is possible to suppress a reduction in measurement accuracy caused by non-light receiving units disposed between picture elements on the imaging surface 8, and to accurately measure the luminance of each pixel.

Embodiment 2

Figure 9:
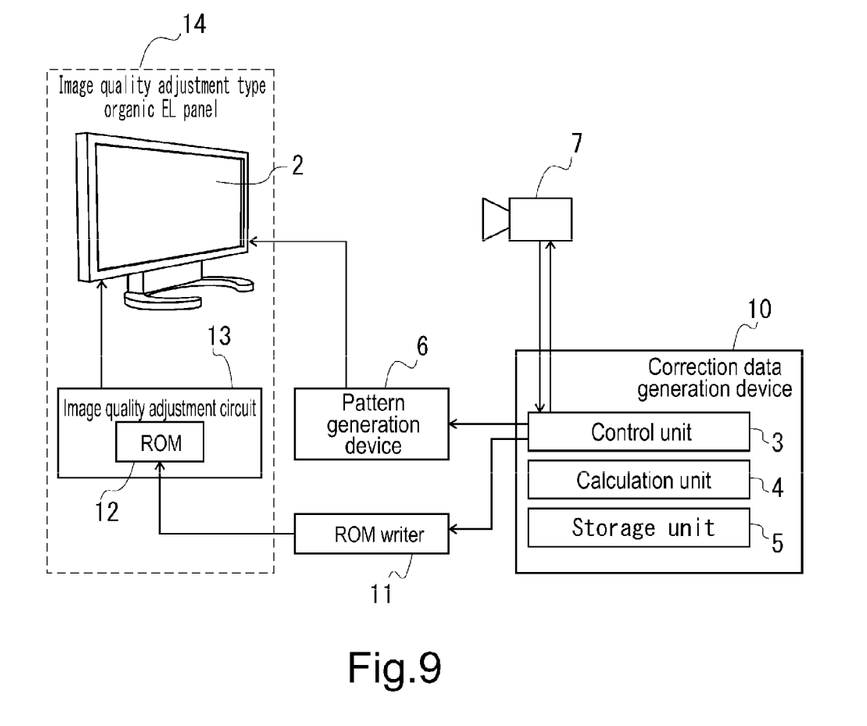
FIG. 9 is a diagram illustrating a correction data generation device according to Embodiment 2.
Figure 10:
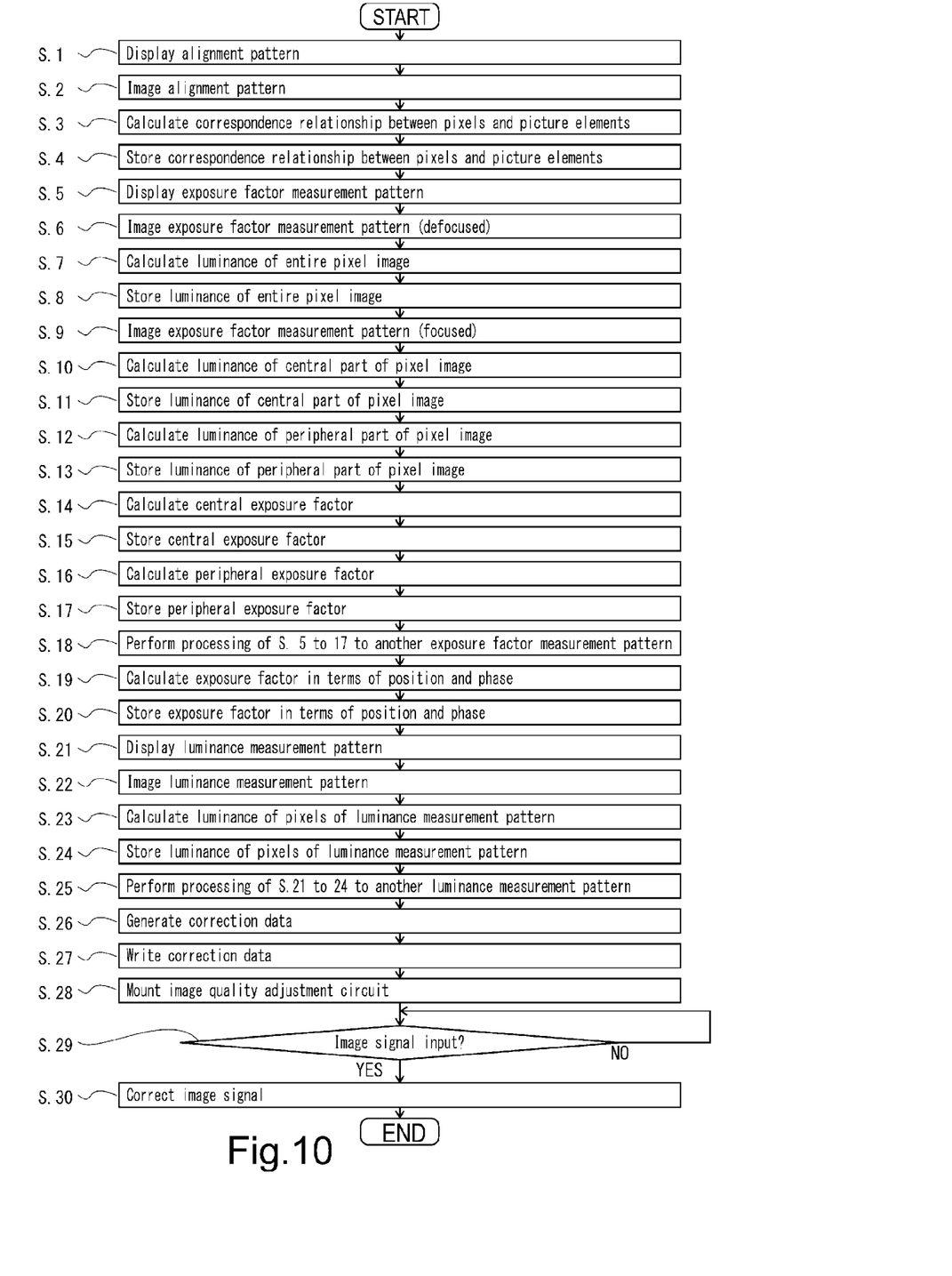
FIG. 10 is a flow diagram illustrating a correction data generation method, a method for manufacturing an image quality adjustment type organic EL panel, and an image quality adjustment method, according to Embodiment 2.

FIG. 9 illustrates a correction data generation device according to the present embodiment. This correction data generation device 10 is configured by additionally connecting a ROM writer 11 to the luminance measurement device 1 according to Embodiment 1. As shown in FIG. 109, the correction data generation device 10, like the luminance measurement device 1, measures the luminance of all pixels of the organic EL panel 2 (steps 1 to 25), and then the calculation unit 4 generates correction data for reducing display unevenness (luminance unevenness) of the organic EL panel 2 on the basis of the luminance of each pixel (step 26). The generated correction data is written in a ROM (nonvolatile memory) 12 by the ROM writer 11 (step 27), and an image quality adjustment type organic EL panel 14 is manufactured by an image quality adjustment circuit 13 in which this ROM 12 is provided being mounted on the organic EL panel 2 (step 28).

In the image quality adjustment type organic EL panel 14, when an image signal is input (step 29), the image quality adjustment circuit 13 corrects the image signal (input signal) that was input to the organic EL panel 2 with reference to the correction data written in the ROM 12, thereby achieving a reduction in display unevenness of the organic EL panel 2 and adjusting image quality (step 30).

In a correction data generation method performed by the correction data generation device 10 according to the present embodiment, and a method for manufacturing the image quality adjustment type organic EL panel 14, like in Embodiment 1, the luminance of each pixel of the organic EL panel 2 is measured, and correction data for reducing display unevenness of the organic EL panel 2 is generated on the basis of the measured luminance of each pixel. Therefore, it is possible to adjust the image quality of the organic EL panel 2 with high accuracy.

Although exemplary embodiments of the present invention have been described above, the present invention is not limited to the above embodiments and may be modified as appropriate without departing from the gist of the present invention.

For example, the display panel for image quality adjustment is not limited to an organic EL panel, and may be a liquid crystal panel, a plasma display panel (PDP), a projector, or the like.

Also, the camera is not limited to a monochrome camera, and may be a color camera. The camera may also enlarge a pixel image by zooming, movement of the camera, or the like instead of defocusing, and image the enlarged image.

Moreover, the definitions of the luminance of the center part and the peripheral parts of a pixel image are not limited to the above description.

REFERENCE SIGNS LIST

1 Luminance measurement device
2 Organic EL panel (Display panel)
3 Control unit
4 Calculation unit
5 Storage unit
6 Pattern generation device
7 Camera
8 Imaging surface
9a to 9p Picture element
10 Correction data generation device
11 ROM writer
12 ROM (Storage unit)
13 Image quality adjustment circuit
14 Image quality adjustment type organic EL panel (image quality adjustment type display panel)

The invention claimed is:

1. A luminance measurement method comprising:
an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other;
an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image;
an all-pixel imaging step of sorting all the pixels of the display panel into a plurality of groups, sequentially turning on the pixels one group after another, and imaging the pixels by the camera; and
a luminance calculating step of calculating the luminance of all the pixels of the display panel on the basis of the image imaged in the all-pixel imaging step, the central exposure factor, and the peripheral exposure factor.

2. The luminance measurement method according to claim 1, further comprising:

an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

3. The luminance measurement method according to claim 1, further comprising:

an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

4. A luminance measurement device comprising:

a control unit that controls turning-on of pixels of a display panel and controls imaging by a camera that is provided with a solid-state image sensor; and a calculation unit that performs calculation based on an image imaged by the camera, wherein, when pixels of the display panel are imaged by the camera, the control unit turns on one or more pixels of the display panel and causes the camera to image the pixels such that each pixel image ranges over a plurality of picture elements on an imaging surface of the camera and the pixel images do not overlap each other, the calculation unit then calculates a central exposure factor that indicates the luminance of a central part of the pixel image as a percentage of the luminance of the entire pixel image, on the basis of an output of one or more picture elements that correspond to the central part of the imaged pixel image, and a peripheral exposure factor that indicates the luminance of a peripheral part of the pixel image as a percentage of the luminance of the entire pixel image, on the basis of an output of one or more picture elements that correspond to the peripheral part of the pixel image, the control unit sorts all the pixels of the display panel into a plurality of groups, sequentially turns on the pixels one group after another, and causes the camera to image the pixels, and the calculation unit then calculates the luminance of all the pixels of the display panel, on the basis of the imaged image, the central exposure factor, and the peripheral exposure factor.

5. The luminance measurement device according to claim 4, wherein the control unit causes the camera to image an alignment pattern that is obtained by turning on predetermined pixels of the display panel, and the calculation unit obtains a correspondence relationship between the pixels of the display panel and the picture elements of the camera by detecting on which picture elements of the camera the image of the alignment pattern is shown.

6. The luminance measurement device according to claim 4, wherein the control unit enlarges the pixel relative to the pixel that is used for obtaining the output of one or more picture elements that correspond to the central part of the pixel image, and the output of one or more picture elements that correspond to the peripheral part of the pixel image, and images the enlarged pixel, and the calculation unit obtains the luminance of the entire pixel image on the basis of the imaged image, and calculates the central exposure factor and the peripheral exposure factor.

7. A correction data generation method comprising:

an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other;

an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image;

an all-pixel imaging step of sorting all the pixels of the display panel into a plurality of groups, sequentially turning on the pixels one group after another, and imaging the pixels by the camera;

a luminance calculating step of calculating the luminance of all the pixels of the display panel on the basis of the image imaged in the all-pixel imaging step, the central exposure factor, and the peripheral exposure factor; and a correction data generation step of generating correction data for reducing luminance unevenness of the display panel by correcting an input signal to the display panel on the basis of the luminance calculated in the luminance calculating step.

8. The correction data generation method according to claim 7, further comprising:

an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

9. The correction data generation method according to claim 7, further comprising:

an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

10. A correction data generation device, comprising:

a control unit that controls turning-on of pixels of a display panel and controls imaging by a camera that is provided with a solid-state image sensor;

a calculation unit that performs calculation based on an image imaged by the camera; and a correction data generation unit that generates correction data for reducing luminance unevenness of the display panel by correcting an input signal to the display panel, wherein, when pixels of the display panel are imaged by the camera, the control unit turns on one or more pixels of the display panel and causes the camera to image the pixels such that each pixel image ranges over a plurality of picture elements on an imaging surface of the camera and the pixel images do not overlap each other, the calculation unit then calculates a central exposure factor that indicates the luminance of a central part of the pixel image as a percentage of the luminance of the entire pixel image, on the basis of an output of one or more picture elements that correspond to the central part of the imaged pixel image, and a peripheral exposure factor that indicates the luminance of a peripheral part of the pixel image as a percentage of the luminance of the entire pixel image, on the basis of an output of one or more picture elements that correspond to the peripheral part of the pixel image, the control unit sorts all the pixels of the display panel into a plurality of groups, sequentially turning on the pixels one group after another, and causes the camera to image the pixels, the calculation unit then calculates the luminance of all the pixels of the display panel, on the basis of the imaged image, the central exposure factor, and the peripheral exposure factor, and the correction data generation unit generates the correction data based on the luminance of all the pixels of the display panel.

11. The correction data generation device according to claim 10, wherein the control unit causes the camera to image an alignment pattern that is obtained by turning on predetermined pixels of the display panel, and the calculation unit obtains a correspondence relationship between the pixels of the display panel and the picture elements of the camera by detecting on which picture elements of the camera the image of the alignment pattern is shown.

12. The correction data generation device according to claim 10, wherein the control unit enlarges the pixel relative to the pixel that is used for obtaining the output of one or more picture elements that correspond to the central part of the pixel image, and the output of one or more picture elements that correspond to the peripheral part of the pixel image, and images the enlarged pixel, and the calculation unit obtains the luminance of the entire pixel image on the basis of the imaged image, and calculates the central exposure factor and the peripheral exposure factor.

13. A method for manufacturing an image quality adjustment type display panel comprising:

an individual-pixel imaging step of, when pixels of a display panel are imaged by a camera provided with a solid-state image sensor, turning on one or more pixels of the display panel and imaging the pixels by the camera such that each pixel image ranges over a plurality of picture elements on an imaging surface of the camera and the pixel images do not overlap each other;

an exposure factor calculation step of calculating a central exposure factor that indicates the luminance of a central part of the pixel image that was imaged in the individual-pixel imaging step as a percentage of the luminance of the entire pixel image, on the basis of an output of one or more picture elements that correspond to the central part of the pixel image, and calculating a peripheral exposure factor that indicates the luminance of a peripheral part of the pixel image as a percentage of the luminance of the entire pixel image, on the basis of an output of one or more picture elements that correspond to the peripheral part of the pixel image;

an all-pixel imaging step of sorting all the pixels of the display panel into a plurality of groups, sequentially turning on the pixels one group after another, and imaging the pixels by the camera;

a luminance calculating step of calculating the luminance of all the pixels of the display panel on the basis of the image imaged in the all-pixel imaging step, the central exposure factor, and the peripheral exposure factor;

a correction data generation step of generating correction data for reducing luminance unevenness of the display panel by correcting an input signal to the display panel on the basis of the luminance calculated in the luminance calculating step;

a correction data storage step of storing the correction data in a storage unit of an image quality adjustment circuit, and a mounting step of mounting the image quality adjustment circuit to the display panel so that the image quality adjustment circuit corrects the input signal on the basis of the correction data.

14. The method according to claim 13, further comprising:

an alignment step of imaging by the camera an alignment pattern that is obtained by turning on predetermined pixels of the display panel, detecting on which picture elements of the camera the image of the alignment pattern is shown, and obtaining a correspondence relationship between the pixels of the display panel and the picture elements of the camera.

15. The method according to claim 13, further comprising:

an enlarging and imaging step of enlarging the pixel relative to the individual-pixel imaging step, imaging the enlarged pixel, and obtaining the luminance of the entire pixel image that is used for calculating the central exposure factor and the peripheral exposure factor.

16. An image quality adjustment type display panel comprising:

a display panel; and an image quality adjustment circuit that is provided with a storage unit in which correction data for correcting an input signal to the display panel so as to reduce display unevenness of the display panel is stored, wherein the storage unit has stored therein correction data that is generated based on the luminance of all the pixels of the display panel, the luminance of all the pixels of the display panel being calculated by, when pixels of the display panel are imaged by a camera that is provided with a solid-state image sensor, turning on one or more pixels of the display panel and imaging the pixels by the camera such that each pixel image ranges over a plurality of picture elements on an imaging surface of the camera and the pixel images do not overlap each other, by calculating a central exposure factor that indicates the luminance in a central part of the pixel image as a percentage of the luminance of the entire pixel image, on the basis of an output of one or more picture elements that correspond to the central part of the imaged pixel image, and a peripheral exposure factor that indicates the luminance in a peripheral part of the pixel image as a percentage of the luminance of the entire pixel image, on the basis of an output of one or more picture elements that correspond to the peripheral part of the pixel image, by sorting all the pixels of the display panel into a plurality of groups, sequentially turning on the pixels one group after another, and imaging the pixels by the camera, and by calculating the luminance of all the pixels of the display panel, on the basis of the imaged image, the central exposure factor, and the peripheral exposure factor.

* * * * *